United States Patent

Woo et al.

[11] Patent Number: 6,103,086
[45] Date of Patent: Aug. 15, 2000

[54] METHOD OF FORMING RELIABLE COPPER INTERCONNECTS WITH IMPROVED HOLE FILLING

[75] Inventors: Christy Woo, Cupertino, Calif.; Axel Preusse, Austin, Tex.; Sergey Lopatin, Santa Clara, Calif.

[73] Assignee: Advanced Micro Devices, Inc., Sunnyvale, Calif.

[21] Appl. No.: 09/225,539

[22] Filed: Jan. 5, 1999

[51] Int. Cl.[7] .............................. C25D 5/56; C25D 5/10; C25D 5/52; C25D 3/38; C23C 28/02

[52] U.S. Cl. .................. 205/164; 205/170; 205/184; 205/222; 205/291; 205/915

[58] Field of Search ................. 205/50, 123, 164, 205/170, 184, 222, 291, 915; 438/14, 687; 257/762

[56] References Cited

U.S. PATENT DOCUMENTS 5,972,192  10/1999  Dubin et al. .......................... 205/101

Primary Examiner—Kathryn Gorgos
Assistant Examiner—Edna Wong

[57] ABSTRACT

The reliability of Cu and Cu alloy interconnects is significantly enhanced by controlling the temperature of the electroplating solution during via opening filling to substantially prevent occlusion of the opening. Embodiments of the present invention include electroplating Cu or a Cu alloy from an electroplating solution at a temperature of about 20° C. or less.

14 Claims, 2 Drawing Sheets

METHOD OF FORMING RELIABLE COPPER INTERCONNECTS WITH IMPROVED HOLE FILLING

TECHNICAL FIELD

The present invention relates to copper (Cu) and Cu alloy metallization in semiconductor devices. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves the formation of an opening which is filled in with a metal. Dual damascene techniques involve the formation of an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more as in submicron technologies, the interconnection capacitance limits the circuit node capacitance loading and, hence, the circuit speed. As integration density increases and feature size decreases in accordance with submicron design rules, the rejection rate due to integrated circuit speed delays significantly reduces manufacturing throughput and increases manufacturing costs.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by CMP. Al is conventionally employed because it is relatively inexpensive, exhibits low resistivity and is relatively easy to etch. However, as the size of openings for vias/contacts and trenches is scaled down to the sub-micron range, step coverage problems have arisen involving the use of Al which has decreased the reliability of interconnections formed between different wiring layers. Such poor step coverage results in high current density and enhanced electromigration. Moreover, low dielectric constant polyamide materials, when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Cu and Cu alloys have received considerable attention as a candidate for replacing Al in VLSI interconnect metallizations. Cu exhibits superior electromigration properties and has a lower resistivity than Al. In addition, Cu has improved electrical properties vis-à-vis W, making Cu a desirable metal for use as a conductive plug as well as conductive wiring.

Electroless plating and electroplating of Cu and Cu alloys offer the prospect of low cost, high throughput, high quality plated films and efficient via, contact and trench filling capabilities. Electroless plating generally involves the controlled autocatalytic deposition of a continuous film on the catalytic surface by the interaction in solution of a metal salt and a chemical reducing agent. Electroplating comprises the electrodeposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100A, can be employed in the form of islets of catalytic metal.

There are, however, significant problems attendant upon the use of conventional Cu interconnect methodology, e.g., electroplating in filling damascene openings. Referring to FIG. 1A, damascene opening 11, such as a contact or via hole, is formed in dielectric layer 10, e.g., silicon dioxide. A seed layer 12 is deposited. Regions of seed layer overhang 12a occur at the corners of the opening 11.

Adverting to FIG. 1B, a Cu or Cu alloy layer 13 is then electroplated in the opening 11 and over the dielectric layer 10. Due to the regions of seed layer overhang 12a and enhanced plating rate caused by the higher electric field at the corners of the opening 11, there is a tendency for the opening 11 to become occluded while the opening is filled, resulting in an unfilled region, i.e., a void 14 in the opening 11. Such voids adversely affect device performance and device stability.

As design rules extend deeper into the submicron range, e.g., about 0.18 micron and under, the reliability of the interconnect pattern becomes particularly critical. Accordingly, preventing occlusion of the opening during electroplating must be addressed.

There exists a need for methodology enabling the formation of Cu and Cu alloy interconnect members having high reliability, high yield, and performance. There exists a particular need for eliminating the occlusion of openings while the openings are filled, as during conventional electroplating.

The present invention addresses and solves the problems attendant upon conventional processes for manufacturing semiconductor devices utilizing electroplating in Cu metallization.

DISCLOSURE OF THE INVENTION

An advantage of the present invention is a method of manufacturing a semiconductor device having highly reliable Cu and Cu alloy interconnect members.

Another advantage of the present invention is a method of manufacturing a semiconductor device comprising a Cu or Cu alloy interconnect member.

Additional advantages and other features of the present invention will be set forth in the description which follows, and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising forming an opening in a dielectric layer and electroplating a Cu or Cu alloy layer in the opening and over the dielectric layer, wherein the temperature of an electroplating solution is controlled to substantially prevent occlusion of the opening while the opening is filled.

Another aspect of the present invention is a method of manufacturing a semiconductor device, the method comprising: forming an opening in a dielectric layer and electroplating a Cu or Cu alloy layer in the opening and over the dielectric layer, and controlling the temperature of an electroplating solution during electrodeposition to substantially prevent the formation of voids in the opening during filling.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

As used throughout this application, the symbol "Cu" denotes elemental or substantially elemental Cu, or a Cu alloy, such as Cu containing minor amounts of tin (Sn), titanium (Ti), germanium (Ge), zinc (Zn), magnesium (Mg) or manganese (Mn).

DESCRIPTION OF THE INVENTION

Figure 1A:
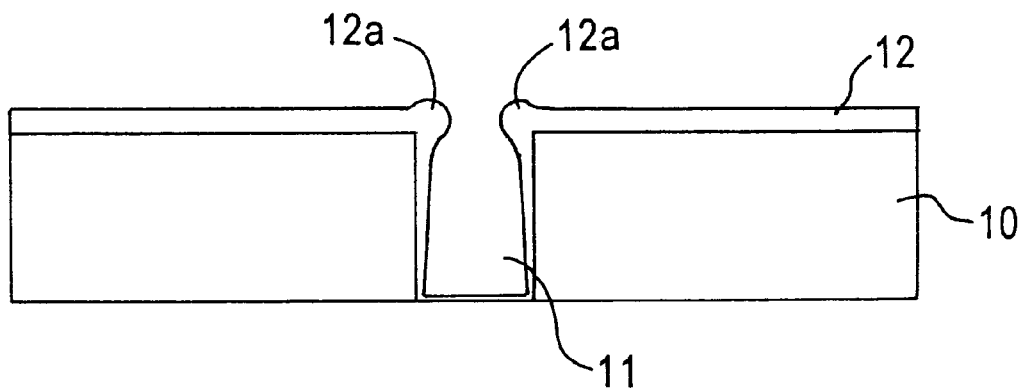
FIGS. 1A–1B schematically illustrate sequential phases of a conventional method utilizing electroplating.
Figure 1B:
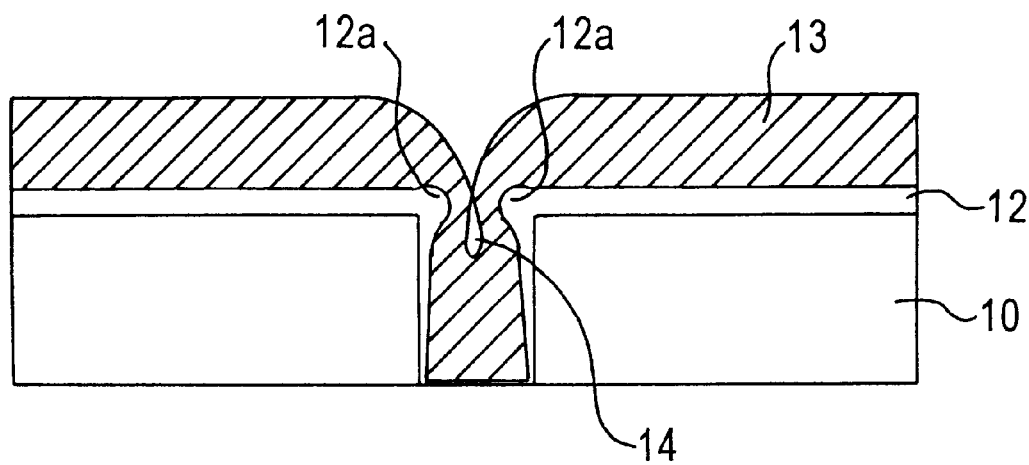

The present invention addresses and solves problems attendant upon manufacturing a semiconductor device comprising a Cu or Cu alloy interconnect, as with electroplating. Specifically, the present invention enables the complete filling of openings in a dielectric layer, such as damascene openings in a silicon oxide layer, preventing occlusion of the opening while the opening is filled.

As design rules are scaled down into the deep submicron range, e.g., about 0.18 micron and under, the reliability of encapsulated Cu and Cu alloy interconnect members becomes increasingly significant. It was found that conventional practices in forming a Cu or Cu alloy interconnect member in an opening by electroplating, such as a damascene opening, result in a region of seed layer overhang and build-up of copper at the corners of the opening, thereby preventing complete, i.e., voidlessly filling the opening. It is believed that such a build-up results from a higher electric field at the corners of the opening. The seed layer overhang coupled with the excessive Cu or Cu alloy build-up at the corners of the opening undesirably cause occlusion of the opening during filling. Consequently, voids are created in the opening, thereby resulting in shorting. The present invention addresses and solves the problem of incomplete filling of openings in a dielectric layer by controlling an electroplating parameter, e.g., temperature of the electroplating bath, during electroplating.

The exact mechanism involved in enhancing voidless filling of the opening by virtue of controlling the temperature of the electroplating solution is not known with certainty. However, it is believed that organic additives present in the electroplating solution inhibit plating when absorbed on the copper surface are desorbed at conventional electroplating solution temperatures, thereby enhancing plating. By controlling the temperature, e.g., reducing the temperature, it is believed that the desorbtion of the organic additive inhibitors can be diminished, thereby enhancing the inhibitory effect of such additives on electroplating and, hence, preventing premature pinching-off at the top of the opening prior to ensure completion of filling. For example, it is believed that electroplating a Cu or Cu alloy in the opening of a dielectric layer at a temperature of about 20° C. or less reduces the desorbtion of organic additive inhibitors, thereby significantly inhibiting closing of the opening before complete filling to prevent occlusion.

The present invention enables the formation of a Cu or Cu alloy interconnect pattern with completely and uniformly filled openings, thereby enhancing product reliance and performance. In accordance with embodiments of the present invention, a layer of Cu or Cu alloy is formed in the opening in the dielectric layer and over the dielectric layer by electroplating from a solution and controlling, the temperature of the electroplating solution to substantially prevent occlusion.

Cu and/or Cu alloy interconnect members formed in accordance with embodiments of the present invention can be, but are not limited to, interconnects formed by damascene technology. Thus, embodiments of the present invention include forming a dielectric interlayer overlying a substrate, forming an opening, e.g., a damascene opening, in the dielectric interlayer, depositing a diffusion barrier layer, such as TaN, depositing a seed layer and filling the opening with Cu or a Cu alloy layer by electroplating. CMP is then performed such that the upper surface of the Cu or Cu alloy layer is substantially coplanar with the upper surface of the dielectric layer. A capping layer, such as silicon nitride, is then deposited in accordance with conventional methodology.

Given the present disclosure and the objectives of the present invention, the electroplating parameters can be optimized in a particular situation. For example, it was found suitable to perform electroplating with an electroplating solution at a temperature of about 20° C. or less, such as about 15 to about 20° C.

In the various embodiments of the present invention, conventional Cu and Cu alloy electroplating solutions, substrates, dielectric interlayers, barrier layers and capping layers can be employed. For example, the substrate can be doped monocrystalline silicon or gallium-arsenide. The dielectric interlayer employed in the present invention can comprise any dielectric material conventionally employed in the manufacture of semiconductor devices. For example, dielectric materials such as silicon dioxide, phospho-silicate-glass (PSG), boron dosed PSG (BPSG), and silicon dioxide derived from tetraethylorthosilicate (TEOS) or silane by PECVD can be employed. The openings formed in dielectric layers can be formed by conventional photolithographic and etching techniques. Dielectric interlayers in accordance with the present invention can also comprise low dielectric materials, including polymers, such as polyimides. The conditions under which a capping layer, such as silicon nitride, are formed are conventional and, hence, not elaborated upon herein.

Figure 2A:
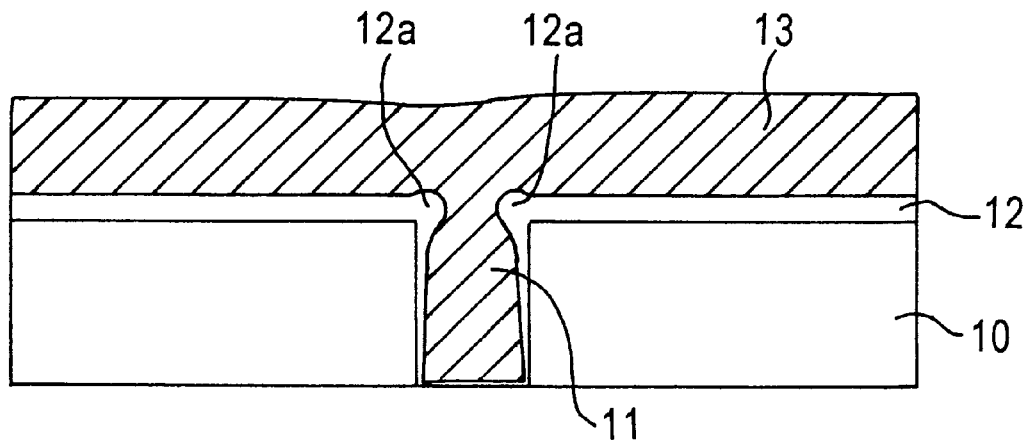
FIGS. 2A–2B schematically illustrate sequential phases of a method in accordance with an embodiment of the present invention.
Figure 2B:
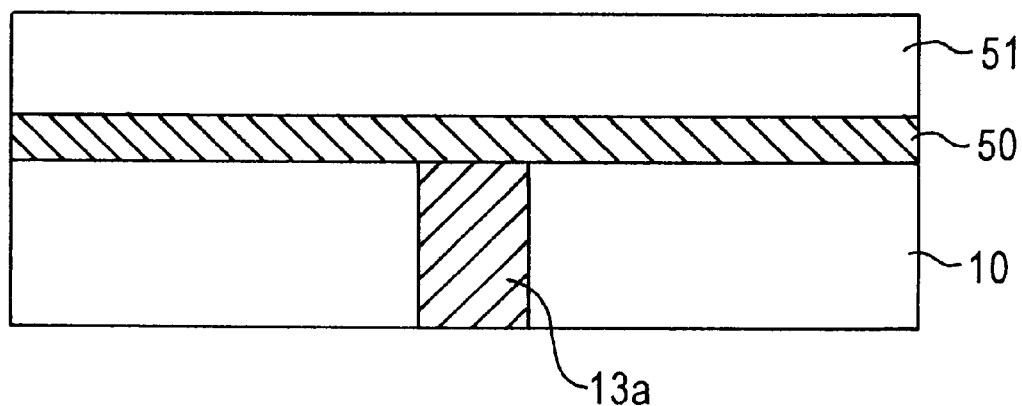

An embodiment of the present invention is schematically illustrated in FIGS. 2A–2B. Adverting to FIG. 2A, damascene opening 11 (Shown filled), such as a contact or via hole, is formed in dielectric layer 10, e.g., silicon dioxide. It should be understood that opening 11 can also be formed as a dual damascene opening comprising a contact or via hole in communication with a trench opening. A conventional barrier layer (not shown for illustrative convenience) is deposited and a seed layer 12 is then deposited. Regions of seed layer overhang 12a occur at the corners of opening 11. Cu or Cu alloy layer 13 is then deposited by electroplating while controlling temperature to prevent occlusion of the opening while the opening is filled. As can be seen, the filled hole is free of voids. The portions of the Cu or Cu alloy layer 13 extending beyond opening 11 are removed, as by CMP.

As shown in FIG. 2B, a capping layer 50, such as silicon nitride, is then formed in a conventional manner completely encapsulating the Cu or Cu alloy interconnect 13A. Another dielectric layer or interlayer 51, such as silicon dioxide derived from TEOS or silane, is then deposited. In this way, a plurality of dielectric interlayers and metallization patterns are built up on a semiconductor substrate and various interconnects are formed.

The present invention enables the formation of extremely reliable Cu or Cu alloy interconnect members by providing a method for eliminating the formation of voids in the Cu or Cu alloy layer filling the opening. Consequently, the present invention advantageously enables substantially voidlessly filling openings. The embodiments of the present invention, significantly improve the reliability of the Cu or Cu alloy interconnect member with an attendant improvement in device reliability and performance.

The present invention is applicable to the formation of various types of inlaid Cu and Cu alloy metallization interconnection patterns. The present invention is particularly applicable in manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:

forming an opening in a dielectric layer;

electroplating a copper (Cu) or Cu alloy layer in the opening and over the dielectric layer from an electroplating solution; and controlling the temperature of the electroplating solution at about 20° C. or less during electroplating to substantially prevent occlusion of the opening.

2. The method according to claim 1, wherein the filled opening is substantially free of voids.

3. The method according to claim 1, comprising:

electroplating at a temperature of about 15 to about 20° C.

4. The method according to claim 1, further comprising:

depositing a seed layer; and, electroplating the Cu or Cu alloy layer on the seed layer.

5. The method according to claim 1, further comprising:

forming the dielectric layer overlying a substrate;

forming an opening in the dielectric layer;

filling the opening;

removing any portion of the Cu or Cu alloy layer beyond the opening by chemical mechanical polishing so that an upper surface of the Cu or Cu alloy layer is substantially coplanar with an upper surface of the dielectric layer; and forming a capping layer on the Cu or Cu alloy layer.

6. The method according to claim 1, comprising depositing a seed layer before electroplating the Cu or Cu alloy layer.

7. The method according to claim 1, wherein the opening is a dual damascene opening comprising a trench and a via or contact hole communicating with the trench.

8. A method of manufacturing a semiconductor device, the method comprising:

forming an opening in a dielectric layer;

electroplating a copper (Cu) or Cu alloy layer in the opening and over the dielectric layer from an electroplating solution; and controlling the temperature of the electroplating solution at about 20° C. or less to substantially prevent the formation of voids in the opening during filling.

9. The method according to claim 8, wherein the filled opening is substantially free of voids.

10. The method according to claim 8, comprising:

electroplating at a temperature of about 15 to about 20° C.

11. The method according to claim 8, further comprising:

depositing a seed layer; and, electroplating the Cu or Cu alloy layer on the seed layer.

12. The method according to claim 8, further comprising:

forming the dielectric layer overlying a substrate;

forming an opening in the dielectric layer;

removing any portion of the Cu or Cu alloy layer beyond the opening by chemical mechanical polishing so that an upper surface of the Cu or Cu alloy layer is substantially coplanar with an upper surface of the dielectric layer; and forming a capping layer on the Cu or Cu alloy layer.

13. The method according to claim 8, comprising depositing a diffusion barrier layer before electroplating the Cu or Cu alloy layer.

14. The method according to claim 8, wherein the opening is a dual damascene opening comprising a trench and a via or contact hole communicating with the trench.

* * * * *